(12) United States Patent
Masai et al.

(10) Patent No.: US 7,785,697 B2
(45) Date of Patent: Aug. 31, 2010

(54) THIN FILM DEVICE

(75) Inventors: Taku Masai, Tokyo (JP); Hitoshi Sakuma, Tokyo (JP); Kyung-Ku Choi, Tokyo (JP); Toshiyasu Fujiwara, Tokyo (JP)

(73) Assignee: TDK Corporation, Tokyo (JP)

( * ) Notice: Subject to any disclaimer, the term of this patent is extended or adjusted under 35 U.S.C. 154(b) by 380 days.

(21) Appl. No.: 11/819,263

(22) Filed: Jun. 26, 2007

(65) Prior Publication Data

US 2008/0003408 A1 Jan. 3, 2008

(30) Foreign Application Priority Data

Jun. 30, 2006 (JP) ............................ P2006-182371

(51) Int. Cl.
*B32B 3/02* (2006.01)
(52) U.S. Cl. .................. 428/172; 336/200; 336/223; 336/232; 360/123; 360/126
(58) Field of Classification Search .............. 428/172; 336/200, 223, 232; 360/123, 125
See application file for complete search history.

(56) References Cited

U.S. PATENT DOCUMENTS

2005/0191518 A1* 9/2005 Solberg .................. 428/687

FOREIGN PATENT DOCUMENTS

| JP | A 05-029146 | 2/1993 |
| JP | 2000-323345 | * 11/2000 |
| JP | A-2000-323345 | 11/2000 |
| JP | A-2003-209331 | 7/2003 |
| JP | 2004-274004 | * 9/2004 |
| JP | A 2004-274004 | 9/2004 |
| JP | A 2004-296816 | 10/2004 |
| JP | 2004-349468 | * 12/2004 |
| JP | A-2004-349468 | 12/2004 |
| JP | A-2005-51097 | 2/2005 |

OTHER PUBLICATIONS

Machine Translation: Kikuchi et al. JP 2004-349468, Dec. 2004.*
Machine Translation: Hayashi JP 2000-323345, Nov. 2000.*

* cited by examiner

*Primary Examiner*—Betelhem Shewareged
*Assistant Examiner*—Sathavaram I Reddy
(74) *Attorney, Agent, or Firm*—Oliff & Berridge, PLC

(57) ABSTRACT

The present invention provides a thin film device in which resin film does not easily separate. In a thin film device, a conductor pattern is formed on one of the main surfaces of a plate-shaped base, and the conductor pattern is covered with a resin film. This conductor pattern has a bottom face disposed on the main surface of the base, a top face that faces the bottom face and is distant from the main surface of the base, and two side faces that connect the bottom face and the top face. A depressed portion is formed in these side faces, and an insulation film extends into the depressed portion.

5 Claims, 9 Drawing Sheets

Fig.5
(a)
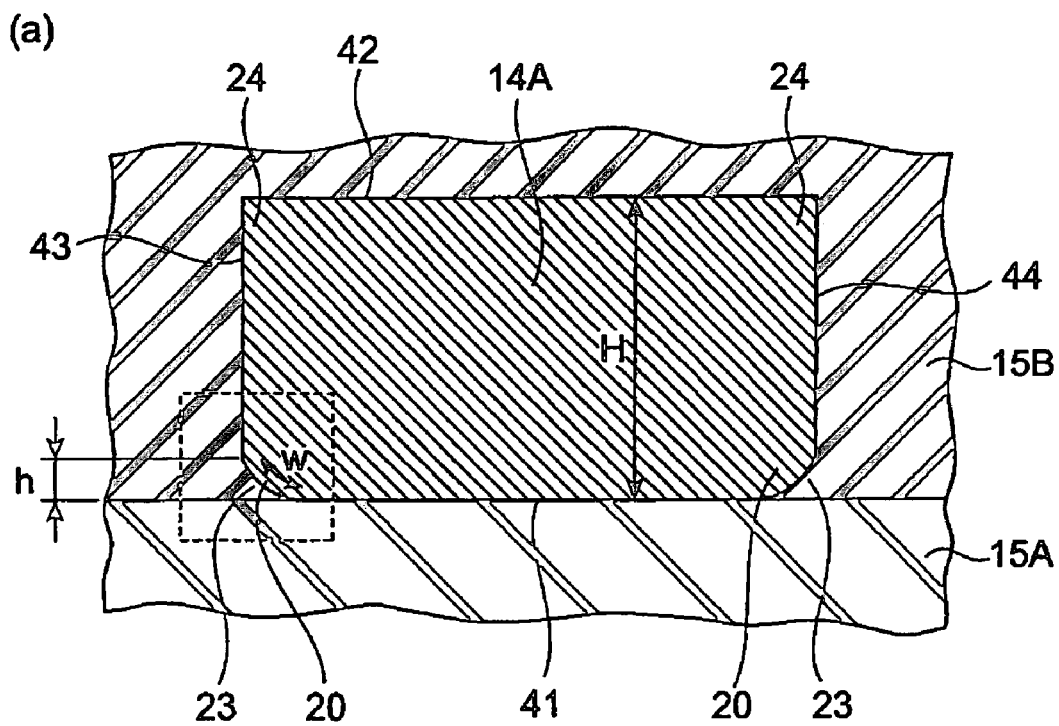
(b)
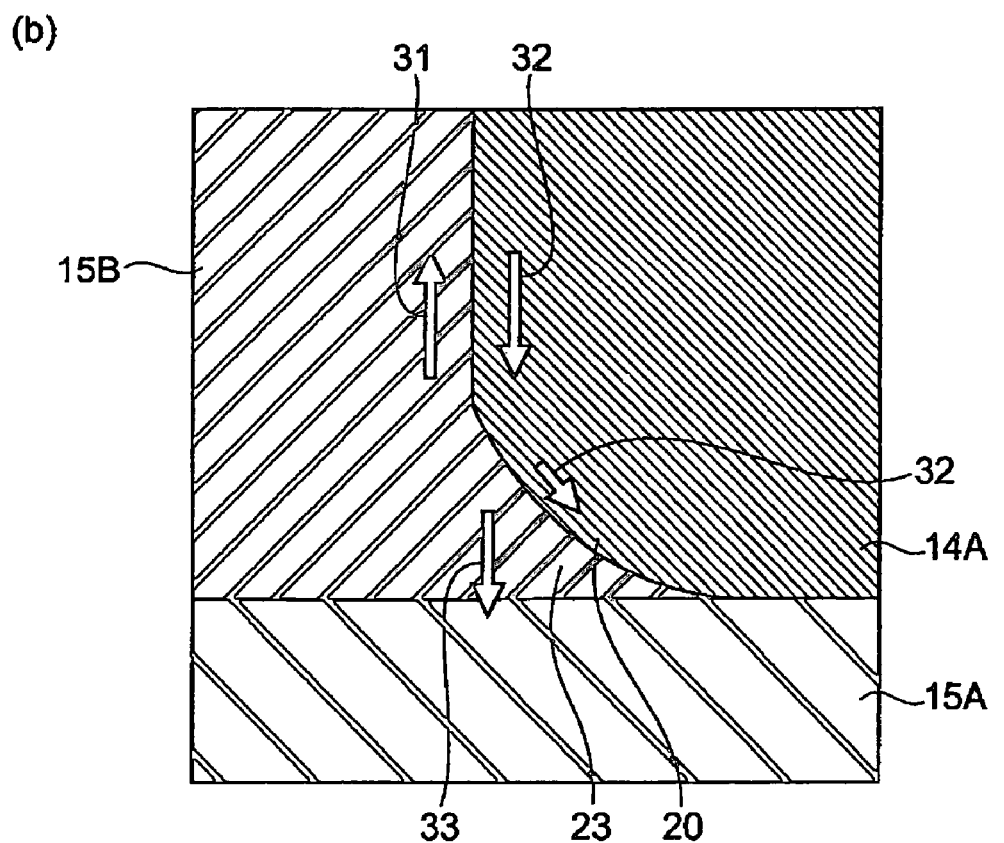

Fig.6
(a)
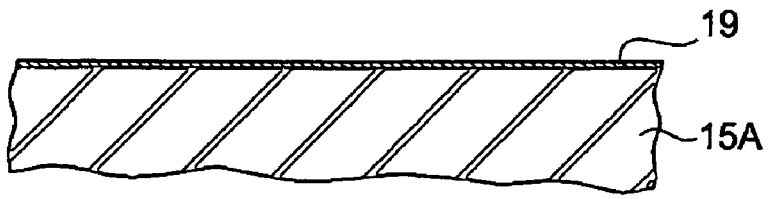
(b)
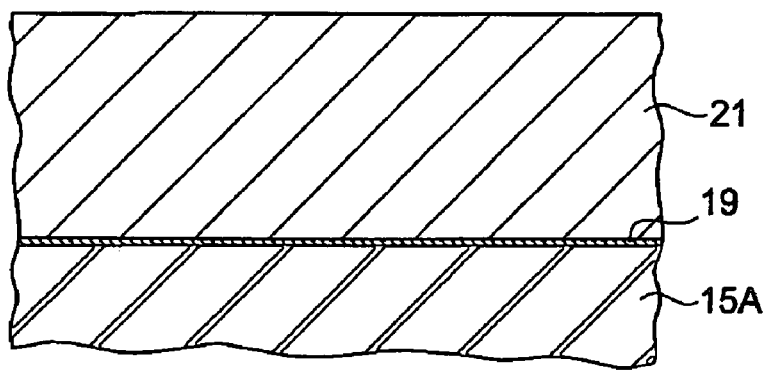
(c)
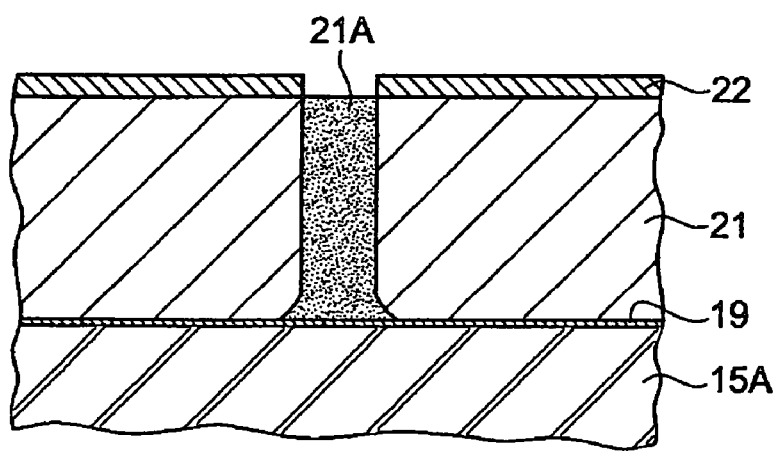
(d)
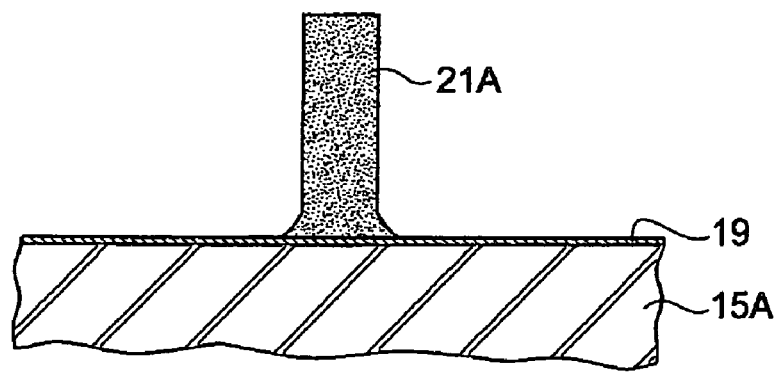

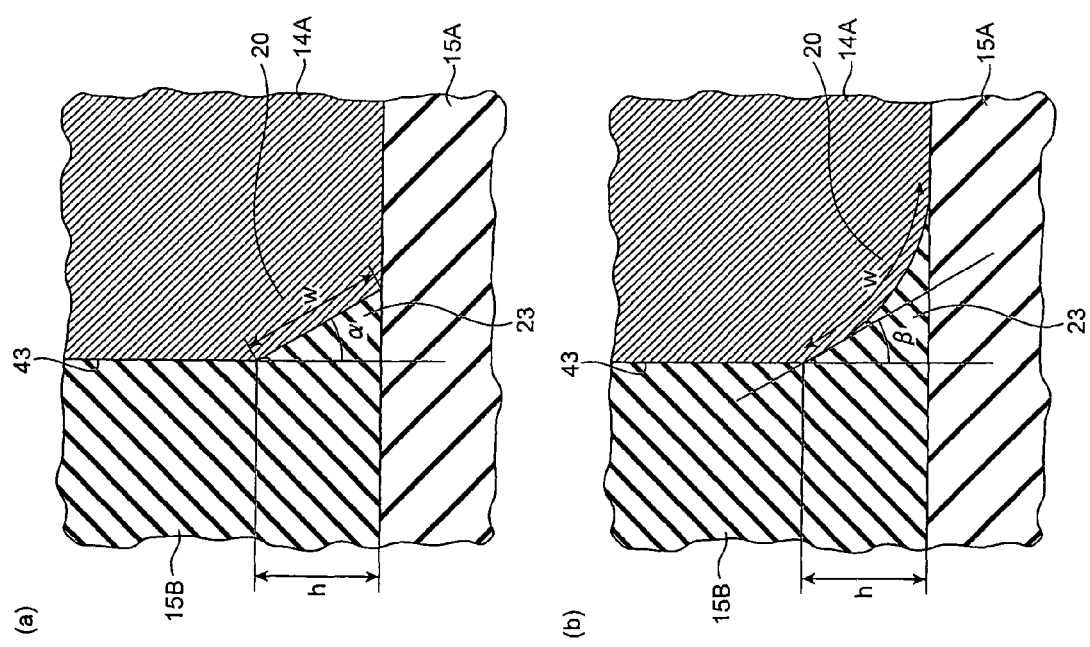
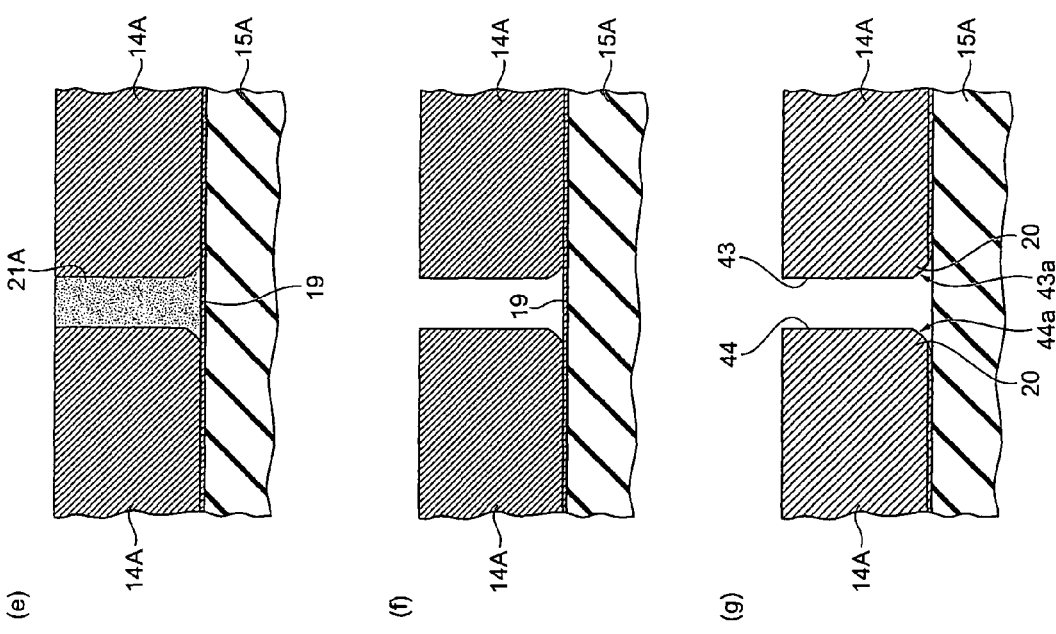
Fig.7
Fig.8

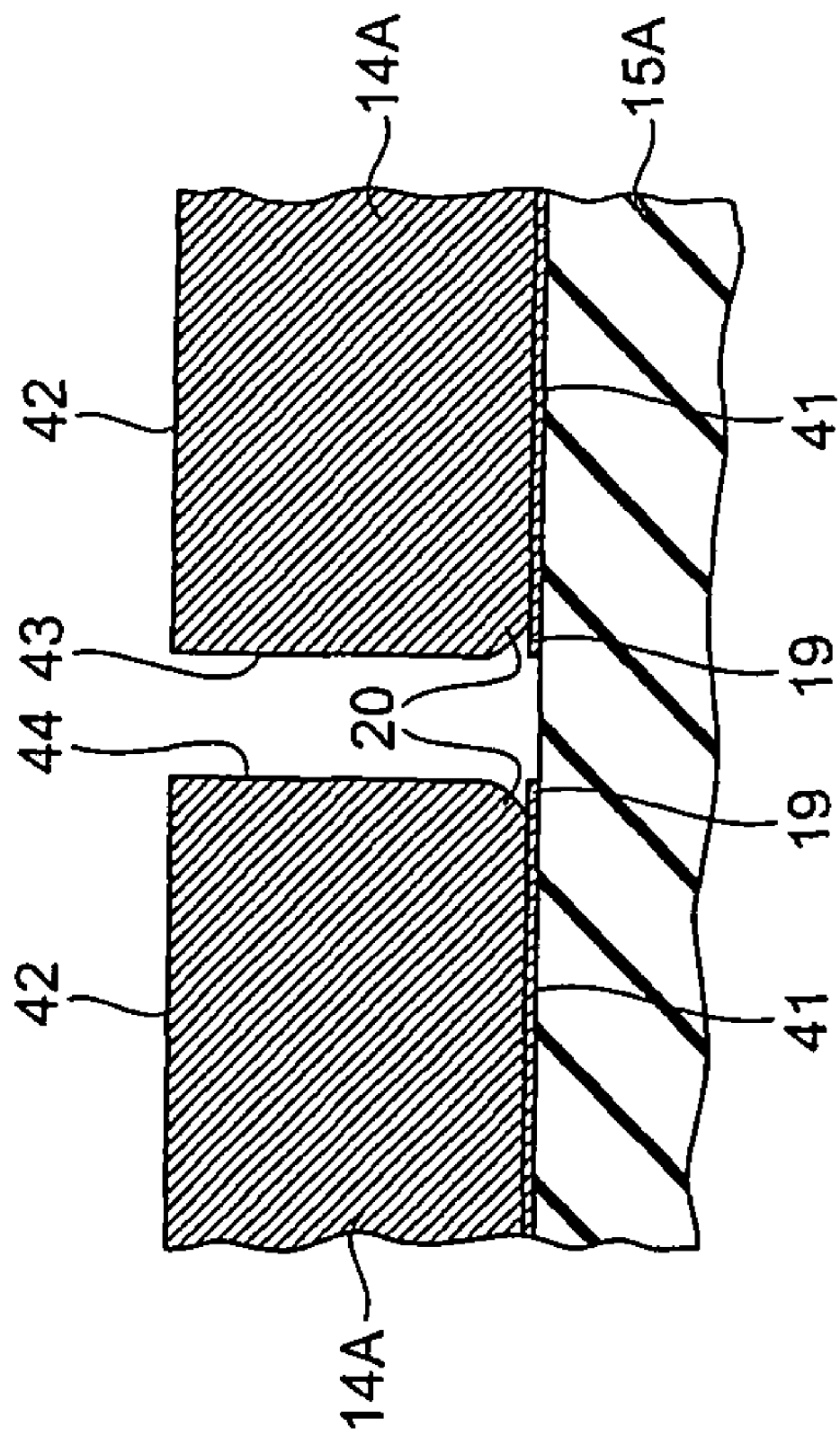

THIN FILM DEVICE

BACKGROUND OF THE INVENTION

1. Field of the Invention

The present invention relates to a thin film device having a conductor pattern covered with a resin film.

2. Related Background Art

A thin film type electronic component formed by a thin film formation technology is mounted on an internal circuit of such electronic equipment as a personal computer, portable telephone and so on. This kind of electronic component is called a "thin film device." A thin film inductor is one example of this kind of electronic component. Recently thin film inductors having a spiral coil or solenoid coil to satisfy the demands for reduced size and lower height have been proposed (Japanese Patent Application Laid-Open No. H5-29146 and No. 2004-296816). An integrated power supply where a substrate on which a power supply IC is formed is combined with a thin film inductor having a solenoid coil has also been proposed (Japanese Patent Application Laid-Open No. 2004-274004).

SUMMARY OF THE INVENTION

In many cases a thin film device has a conductor pattern covered with an insulation film on a substrate. In the case of a thin film inductor having a solenoid coil as a conductor pattern, for example, an insulation film is formed between a magnetic core made of a metal magnetic substance, and the solenoid coil. Resin can be used for a material of the insulation film. However, a thermal expansion coefficient of a resin is considerably higher than that of a metal or a semiconductor constituting the conductor pattern or the substrate. Therefore the amount of expansion or shrinkage according to temperature change greatly differs between the resin film and the substrate or conductor pattern, and as the result resin film easily separates.

With the foregoing in view, it is an object of the present invention to provide a thin film device in which resin film does not easily separate.

A thin film device according to the present invention comprises a plate-shaped base, a conductor pattern formed on one of the main surfaces of the base, and a resin film that is formed on the main surface, and covers the conductor pattern. The conductor pattern has a bottom face disposed on the main surface, a top face that faces the bottom face and is distant from the main surface, and two side faces that connect the bottom face and the top face. A depressed portion is formed in at least one of the two side faces, and the resin film extends into the depressed portion.

By the depressed portion formed in the side face of the conductor pattern, the contact area of the conductor pattern and the resin film increases, and a part of the resin film extending into the depressed portion exhibits an anchor effect, so the resin film does not easily separate.

The depressed portion may be formed in an edge region adjacent to the bottom face of the side faces of the conductor pattern. This depressed portion faces the base, so a resist pattern having a complementary shape can be formed by using a reflection or optical function of a resist exposing beam on the base. Therefore the thin film device having this depressed portion can be fabricated without increasing the number of processing steps.

The thin film device according to one aspect of the present invention has a first and a second conductor pattern adjacent to each other as the conductor pattern, and the depressed portion of the first conductor pattern may face the depressed portion of the second conductor pattern. The first and the second conductor patterns may be interconnected or may be distant from each other. By the pair of depressed portions facing each other, the insulation film even less easily separates.

The conductor pattern may have base side corner sections chamfered by a depressed portion. Since sharp corner portions are eliminated from the conductor pattern by chamfering, a drop in effective cross-section due to the skin effect of the conductor pattern can be suppressed. As a result, an increase in the AC resistance value of the conductor pattern in the high frequency band is suppressed.

The base side corner section may be chamfered so that the surface thereof forms a curved surface. According to this configuration, the resin film separates even less easily than the case of the base side corner section which is chamfered flat.

A line of intersection between the surface of the chamfered base side corner section and a plane vertical to the direction of the base side corner section extending may have a total length w and maximum height h from the main surface of the base, where w/h may be 1.15 or more. According to this configuration, separation of the resin film can be effectively suppressed.

The depressed portion may be filled with the resin film. In this case, the resin film is even less easily separated.

At least one of the upper side corner sections of the conductor pattern may be chamfered. Since stress does not concentrate much on the chamfered upper side corner section, the resin film does not easily separate at the upper side of the conductor pattern.

According to the present invention, a thin film device in which resin film does not easily separate can be provided.

BRIEF DESCRIPTION OF THE DRAWINGS

FIG. 5 are enlarged partial cross-sectional views of the first embodiment;

FIG. 6 are cross-sectional views depicting fabrication steps of a lower conductor;

FIG. 7 are cross-sectional views depicting fabrication steps of a lower conductor;

FIG. 8 are enlarged partial cross-sectional views depicting a base side corner section chamfered flat or to be a curved surface;

FIG. 11 is a cross-sectional view depicting a seed layer that remains under the base side corner section.

DESCRIPTION OF THE PREFERRED EMBODIMENTS

Embodiments of the present invention will be described with reference to the accompanying drawings. In the description of the drawings, the same composing elements are denoted with identical reference symbols, and redundant description is omitted.

First Embodiment

Figure 1:
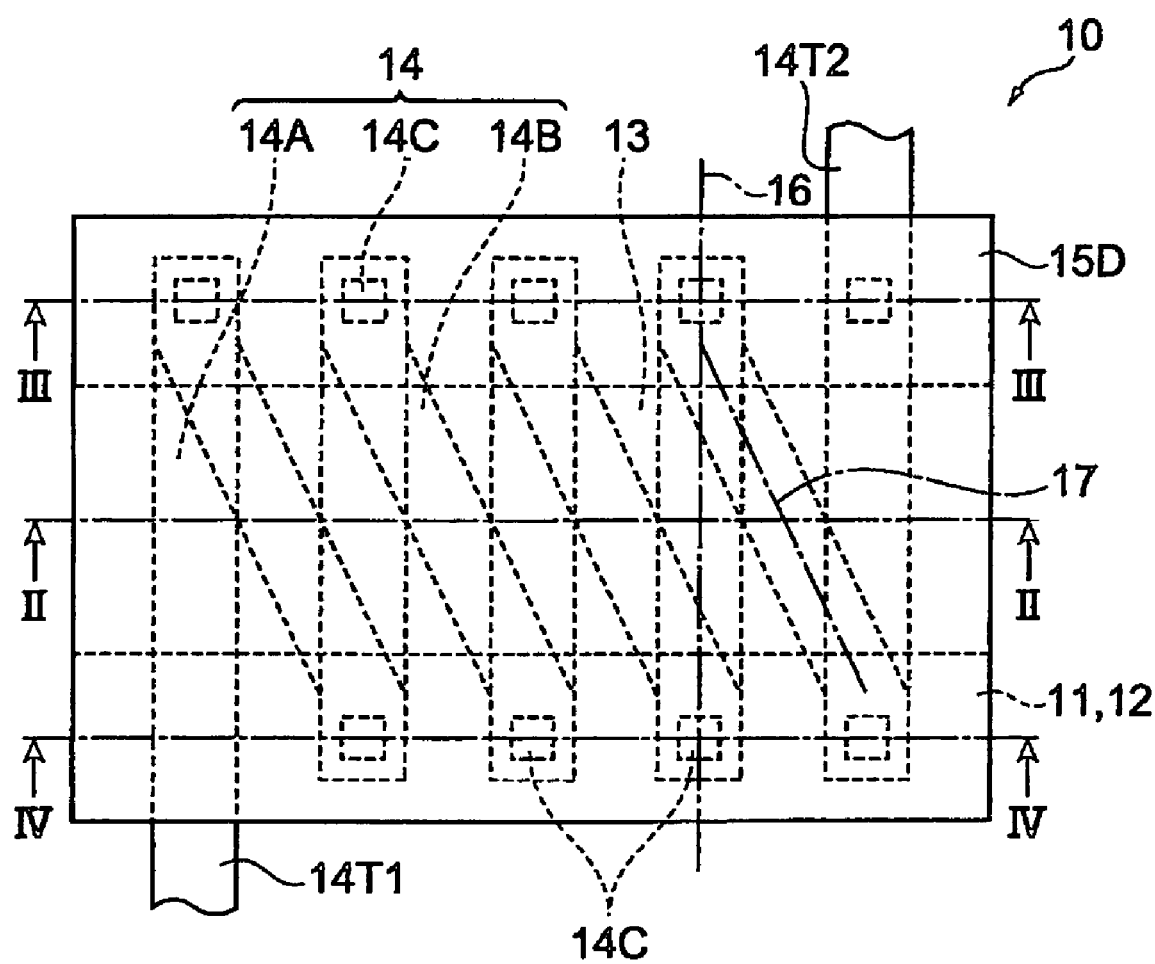
FIG. 1 is a plan view depicting a thin film device according to a first embodiment.
Figure 2:
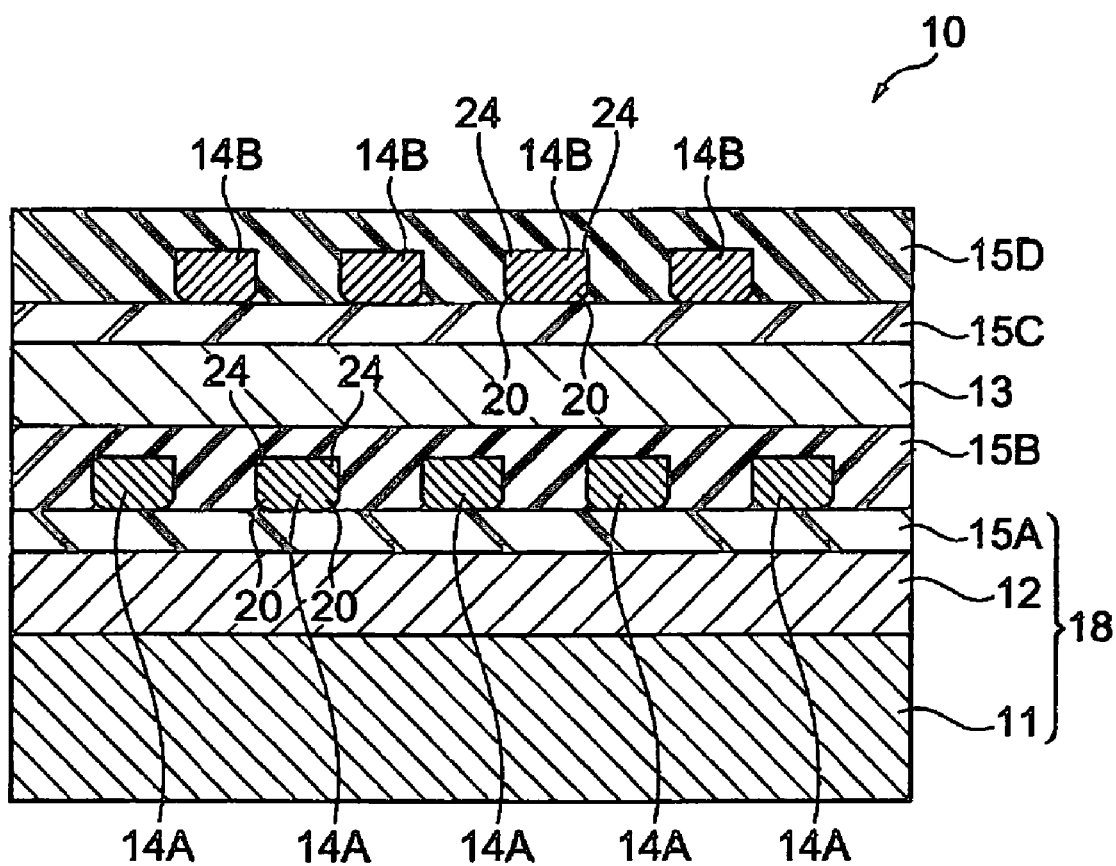
FIG. 2 is a cross-sectional view sectioned at the II-II line in FIG. 1.
Figure 3:
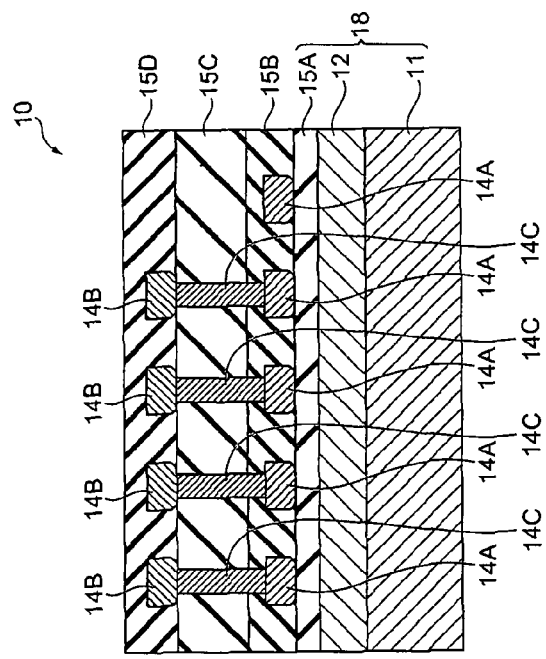
FIG. 3 is a cross-sectional view sectioned at the III-III line in FIG. 1.
Figure 4:
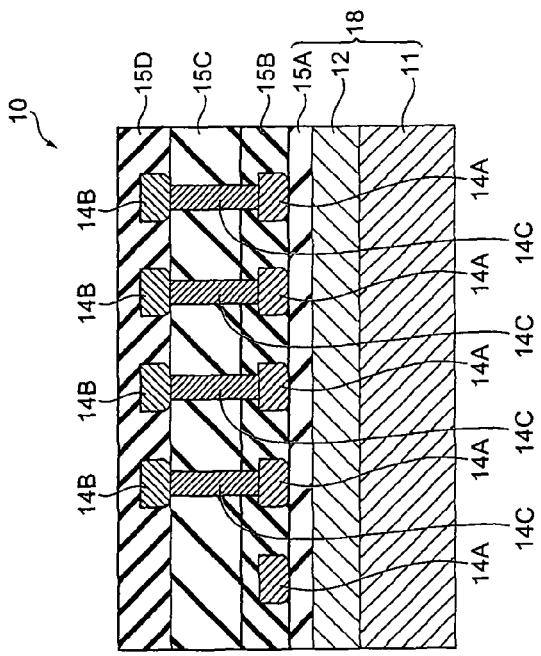
FIG. 4 is a cross-sectional view sectioned at the IV-IV line in FIG. 1.

FIG. 1 is a plan view depicting a thin film device according to the first embodiment of the present invention, and FIG. 2 to FIG. 4 are cross-sectional views sectioned at the II-II line, III-III line and IV-IV line in FIG. 1 respectively. The thin film device of the present embodiment is a thin film inductor 10 having a solenoid coil 14 as a conductor pattern. The solenoid coil 14 is comprised of a plurality of interconnected conductor patterns, that is a lower conductor 14A, an upper conductor 14B and a connection conductor 14C. From the two lower conductors 14A positioned at both ends of the solenoid coil 14, interconnections 14T1 and 14T2 are extended respectively.

As FIG. 2 to FIG. 4 show, the solenoid coil 14 and the interconnections 14T1 and 14T2 are formed on one of the main surfaces (top face) of the substrate 11. The top face of the substrate 11 is sequentially covered by a lower magnetic film 12 and an insulation resin film 15A, and these films 12 and 15A and the substrate 11 constitute a plate-shaped base 18. Lower conductors 14A are directly formed on one of the main surfaces of the base 18, that is on a flat top face of the insulation film 15A. These lower conductors 14A are disposed with a predetermined space. On the top face of the insulation film 15A, an insulation resin film 15B, which covers the lower conductors 14A, is also formed.

An upper magnetic film 13 and an insulation resin film 15C are sequentially formed on the top face of the resin film 15B, and the upper conductors 14B are directly formed on the top face of the resin film 15C. These upper conductors 14B are disposed with a predetermined space. An insulation resin film 15D, which covers the upper conductors 14B, is formed on the top face of the resin film 15C. The lower conductor 14A and the upper conductor 14B are electrically connected via a connection conductor 14C which penetrates the resin films 15B and 15C. In the present embodiment, the substrate 11 is Si, the resin films 15A to 15D are polyimide, the conductors 14A to 14C, and the interconnections 14T1 and 14T2 are copper.

The lower conductor 14A and the connection conductor 14C are rectangular parallelepiped, and the upper conductor 14B is comprised of rectangular parallelepiped end portions and a quadrangular center portion connecting these end portions. As FIG. 1 shows, the end portions of the upper conductor 14B extend in parallel with the lower conductor 14A. The center line 17 of the center portion of the upper conductor 14B is inclined from the center line 16 of the lower conductor 14A. As FIG. 2 to FIG. 4 show, each of the lower conductors 14A and upper conductors 14B is comprised of a bottom face disposed on the top face of the resin film 15A, a top face which faces the bottom face and is distant from the resin film 15A, and two side faces which connect the bottom face and the top face, and are vertical to the top face of the resin film 15.

In FIG. 2, 20 shows a base side corner section of the lower conductor 14A and upper conductor 14B, and 24 shows an upper side corner section of each conductor. The base side corner section 20 is a corner section connecting the bottom face and side face of the conductor 14A or 14B, and the upper side corner section is a corner section connecting the top face and side face of the conductor 14A or 14B. The corner sections 20 and 24 of the lower conductor 14A extend in parallel with the center line 16. The corner sections 20 and 24 also extend in parallel with the center line 16 at both end portions of the upper conductor 14B, but the corner sections 20 and 24 extend in parallel with the center line 17 at the center portion.

FIG. 5 are enlarged partial cross-sectional views of the thin film inductor 10, where (a) shows a cross-section vertical to the center line 16 of the lower conductor 14A, and (b) shows a further enlarged view of the portion enclosed with the broken line in (a). In FIG. 5, 41 shows a bottom face of the lower conductor 14A, 42 is a top face, and 43 and 44 are side face thereof. In each of the side faces 43 and 44, a depressed portion which extends in parallel with the center line 16 is formed in edge regions adjacent to the bottom face 41 respectively, and the depressed portion is filled with the insulation film 15B. By these depressed portions, the two base side corner sections 20 of the lower conductor 14A are chamfered so that the surface thereof forms a curved surface. In the same way, the two base side corner sections 20 of the upper conductor 14B as well are chamfered by a similar depressed portion formed in both sides of the upper conductor 14B, so that the surface thereof forms a curved surface. The chamfered base side corner section 20 plays a part of suppressing the separation of the resin film 15B. This aspect will be described later.

Now the fabrication method of the lower conductor 14A will be described. FIG. 6 and FIG. 7 are cross-sectional views depicting the fabrication steps of the lower conductor 14A. In FIG. 7, the space between the lower conductors 14A is drawn shorter than that in FIG. 1 to FIG. 4 to make explanation easy.

First the lower magnetic film 12 and the resin film 15A are sequentially formed on the substrate 11, and then a seed layer 19 for plating is formed on the top face of the resin film 15A ((a) of FIG. 6). On this seed layer 19, a film resist 21 is layered ((b) of FIG. 6), and the photo mask 22 is formed thereon, then the film resist 21 is exposed ((c) of FIG. 6).

In the present embodiment, a material having a high reflectance is used for the seed layer 19, and the power of the exposure beam, which irradiates on the film resist 21, is increased compared to normal cases. For example, the exposure value is set to 250 mJ, while normally it is 150 mJ. By increasing the exposure value, the power of the exposure beam which is irregularly reflected by the seed layer 19 increases. As a result, the beam reflected diagonally to the top face of the resin film 15A exposes the film resist 21, even if the exposure beam is irradiated vertically to the top face of the resin film 15A. As a result of this, as (c) of FIG. 6 shows, the exposure area 21A of which width spreads at the bottom near the seed layer 19 can be formed.

Then the film resist 21 is developed and the portions other than the exposed area 21A are removed ((d) of FIG. 6). The remaining exposed area 21A is a resist pattern. This resist pattern 21A has a shape complementary with the lower conductor 14A.

Then the lower conductor 14A is formed by plating the copper on the seed layer 19 ((e) of FIG. 7). Then the resist pattern 21A is removed ((f) of FIG. 7), and the seed layer 19 exposed from the area between the lower conductors 14A is removed by wet etching ((g) of FIG. 7). In this way, the lower conductor 14A, where the based side corner sections 20 are chamfered, is formed. As (g) of FIG. 7 shows, a depressed portion 43a of the side face 43 of the lower conductor 14A faces a depressed portion 44a of the side face 44 of the adjacent lower conductor 14A.

Then the resin film 15B, top magnetic film 13 and resin film 15C are sequentially formed so as to cover the lower conductor 14A, and the upper conductor 14B is formed on the resin film 15C in the same method as the lower conductor 14A. Then the resin film 15D is formed so as to cover the upper conductor 14B. In this way, the thin film inductor 10 is completed. According to this manufacturing method, the thin film device 10 having the base side corner sections 20 chamfered by the depressed portions 43a and 44a can be fabricated without increasing the number of processing steps from the conventional method.

The advantage of the thin film inductor 10 will now be described with reference to FIG. 5. The base side corner sections 20 chamfered by the lower conductor 14A exhibit the effect of suppressing the separation of the resin film 15B. This is because the base side corner sections 20 are chamfered, which increases the contact area between the lower conductor 14A and the resin film 15B, compared with the case of base side corner sections which are at right angles, and the portions 23 of the resin film 15B extending under the base side corner sections 20 exhibits an anchor effect. This aspect will now be described in detail.

The thermal expansion coefficient differs greatly between the resin film 15B and the base 18 of which base material is the semiconductor substrate 1 or the lower conductor 14A made of metal. Therefore the difference of the expansion amount or the shrinkage amount between the resin film 15B and the base 18, depending on the temperature change, is large, and this difference causes stress on the resin film 15B. In the present embodiment, for example, the resin film 15B is made of polyimide, which is a heat curing resin, so when the resin film 15B is formed, the polyimide coated on the lower magnetic film 12 is cured by heat, then cools down to normal temperature. During this cooling the polyimide shrinkage is relatively large, so stress is generated on the resin film 15B. If the component in the vertical direction with respect to the top face of the base 18 is high in stress, the resin film 15B separates from the base 18.

In (b) of FIG. 5, the arrow mark 31 indicates this upward vertical stress. The adhesion 32 at the interface between the resin film 15B and the lower conductor 14A prevents separation of the resin film 15B by resisting this stress 31. The effect of the adhesion 32 is higher as the area where the resin film 15B contacting the lower conductor 14A is larger. The chamfered base side corner section 20 has a larger contact area with the resin film 15B than that of the right angle corner section, so separation of the resin film 15B can be suppressed. The sheer stress 33 of the portion 23, which protrudes under the base side corner section 20 (hereafter called "protruded portion") out of the resin film 15B, also resists the stress 31, so this also makes it difficult for the resin film 15B to separate. Particularly in the present embodiment, the base side corner sections 20 of the adjacent lower conductors 14A face each other, and the sheer stress 33 of the protruded portion 23 positioned under each base side corner section 20 also acts on the insulation film 15B, which fills the space of the lower conductors 14A, so insulation film 15B separates even less easily.

In the following description, the magnitude of the stress 31 generated in the resin film 15B is represented by $\sigma$ [MPa], and the height (thickness) of the lower conductor 14A is represented by H [μm]. In this case, the stress applied to the interface between the resin film 15B and the lower conductor 14A is represented by $\sigma H$ [MPa·μm]. The adhesion 32 between the resin film 15B and the lower conductor 14A is represented by P [MPa], the sheer stress 33 of the protruded portion 23 is represented by Q [MPa], the total length of the line of the intersection between the plane vertical to the center line 16 of the lower conductor 14A and the base side corner section 20 is represented by w [μm], and the maximum height of the line of the intersection from the top face of the resin film 15B is represented by h [μm]. In this case, the total of the adhesion 32, applied to the interface between the resin film 15B and the lower conductor 14A and the sheer stress 33, is represented by P(H−h)+Pw+Qh.

The conditions whereby separation does not occur is when the total of the adhesion 32 and the sheer stress 33 at the interface between the insulation film 15B and the lower conductor 14A is greater than the stress 31, and this is represented by the equation below.

$$P(H-h)+Pw+Qh \geq \sigma H \quad (1)$$

This is transformed into the equation below.

$$P+(Pw-Ph+Qh)/H \geq \sigma \quad (2)$$

When the base side corner sections 20 are not chamfered and are at right angles, the conditions when separation does not occur are is represented by the equation below.

$$P \geq \sigma \quad (3)$$

In the case of the chamfered base side corner section 20, w>h is always established so that the left hand side of (2) is always greater than the left hand side of (3). Therefore when a same stress $\sigma$ is applied, separation occurs less likely if the base side corner section 20 is chamfered.

Even if the base side corner section 20 is chamfered flat, w>h is established, and the contact area with resin film 15B increases, so separation of the resin film 15B can be suppressed. But if the base side corner section 20 is chamfered to be a curved surface, as in the case of this embodiment, the contact area further increases and the effect of suppressing separation further increases.

It is preferable that the base side corner section 20 is chamfered such that w/h becomes 1.15 or more. This will now be described with reference to FIG. 8. FIG. 8 are enlarged partial cross-sectional views of the base corner section 20 chamfered into a flat shape or into a curved surface.

As (a) of FIG. 8 shows, if the base side corner section 20 is chamfered flat, separation of the resin film 15B can be sufficiently suppressed by the sheer stress of the protruded portion 23 if the angle $\alpha$, formed by the surface of the base side corner section 20 and the extended plane of the side face 43 of the lower conductor 14A, is 30° or more. If the angle $\alpha$ is less than 30°, the resin film 15B easily slips along the surface of the base side corner section 20, and the resin film 15B easily separates. If $\alpha$ is 30°, w is 1.15 h.

As (b) of FIG. 8 shows, if the surface of the base side corner section 20 is chamfered to form a curved surface, it is preferable that angle $\beta$, formed by the connecting plane at the connection section of this surface and the side face 43 and the extended plane of the side face 43 of the lower conductor 14A, is 30° or more. If $\beta$ is 30°, w is greater than 1.15 h. This means that if w/h is 1.15 or more, the separation of the resin layer 15B can be effectively suppressed.

The lower conductor 14A was described thus far, but the same advantage can be obtained from the upper conductor 14B as well. In other words, the chamfered base side corner sections 20 of the upper conductor 14B suppress the separation of the resin film 15D.

Second Embodiment

Figure 9:
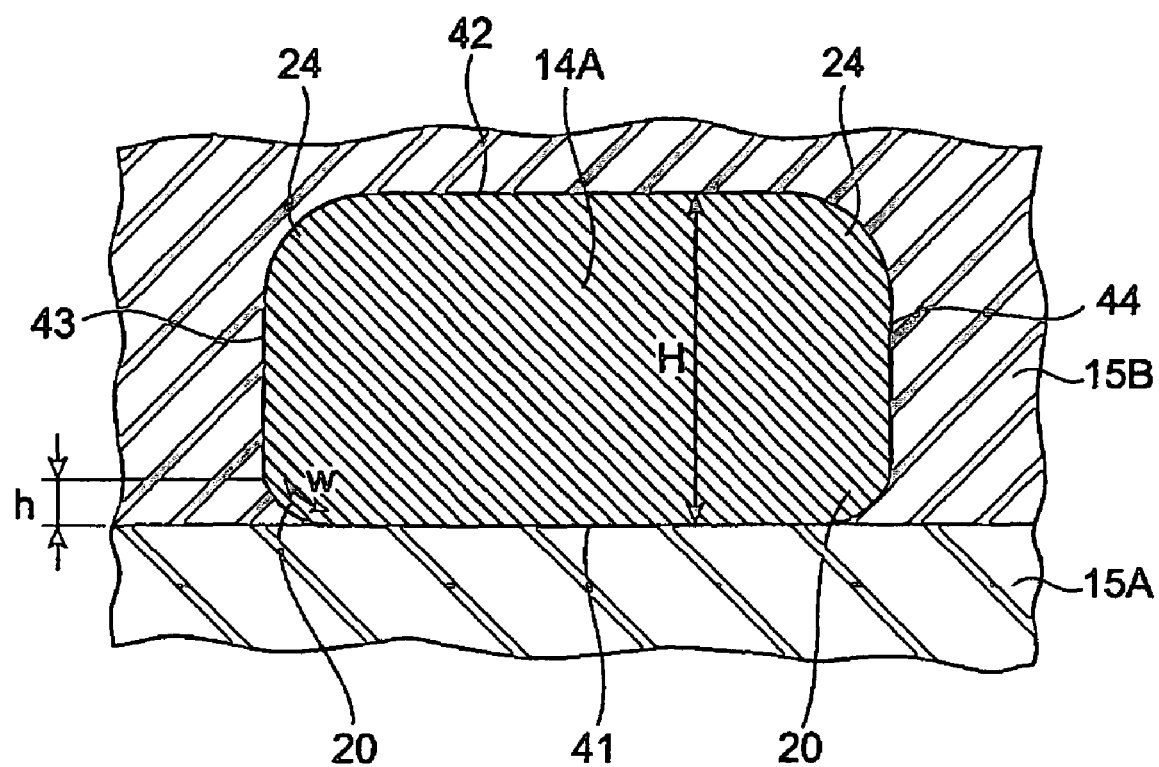
FIG. 9 is an enlarged partial cross-sectional view depicting a lower conductor according to a second embodiment.

Now a thin film device according to the second embodiment of the present invention will be described with reference to FIG. 9. FIG. 9 is an enlarged partial cross-sectional view depicting the lower conductor 14A according to the second embodiment. In the present embodiment, not only the base side corner sections 20 of the lower conductor 14A, but the upper side corner sections 24 as well are chamfered so that the surface thereof forms a curved surface. In the same way, the upper side corner sections 24 of the upper conductor 14B are also chamfered so that the surface thereof forms a curved surface. The rest of the configuration is the same as the first embodiment. Chamfering of the upper side corner sections 24 can be implemented by adjusting the plating conditions for forming the lower conductor 14A and the upper conductor 14B (e.g. composition of plating bath, current density).

If the upper corner sections 24 of the lower conductor 14A are not chamfered and are at right angles, the stress in parallel with the top face of the lower conductor 14A and the stress in parallel with the side face of the lower conductor 14A tend to concentrate on the upper side corner sections 24, and this promotes the separation of the resin film 15B. This is the same for the upper conductor 14B as well. A conductor pattern having the upper corner sections, which are not at right angles but are at acute angles, is known, but in this case stress tends to concentrate on the upper corner sections even more, and the resin film separates more easily. In the case of the present embodiment, on the other hand, the upper corner sections 24 are chamfered, and stress does not concentrate there so easily, therefore the separation of the resin films 15B and 15D does not occur easily at the top of the conductors 14A and 14B.

Third Embodiment

Figure 10:
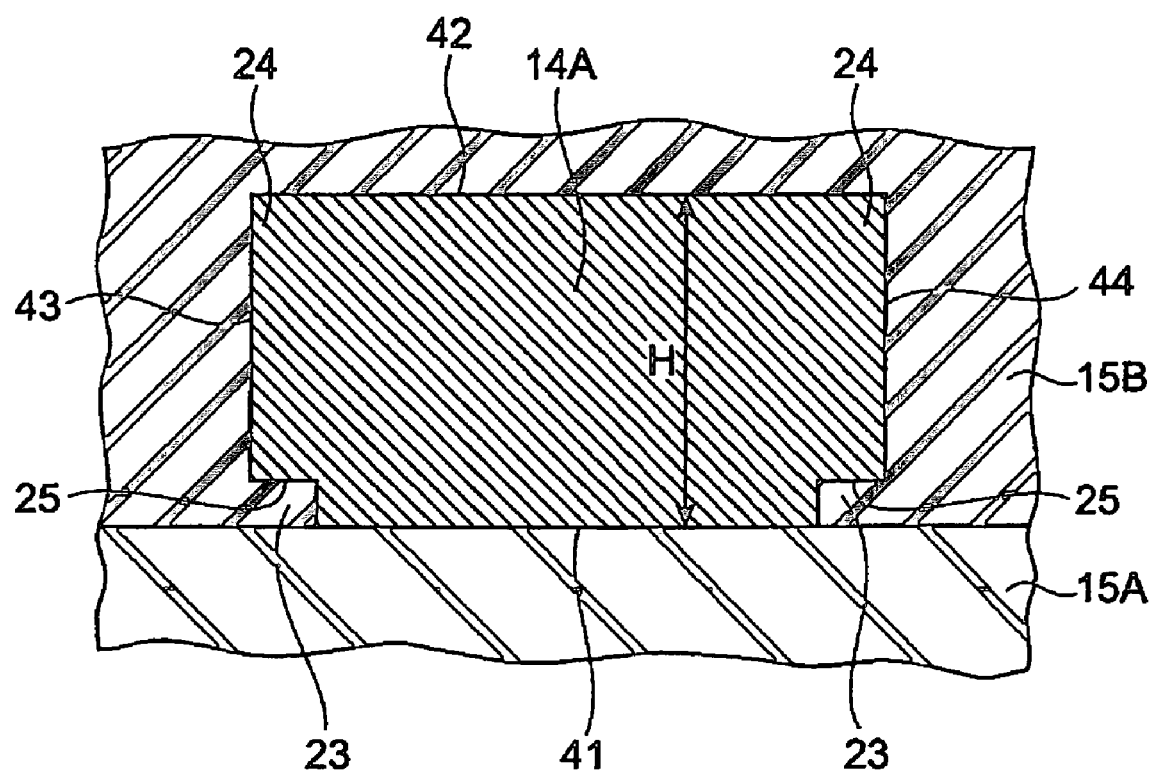
FIG. 10 is an enlarged partial cross-sectional view depicting a third embodiment.

A thin film device according to the third embodiment of the present invention will now be described with reference to FIG. 10. FIG. 10 is an enlarged partial cross-sectional view depicting the lower conductor 14A according to the third embodiment. In this embodiment, a depressed portion 25, which is indented vertically, is formed in each side face 43 and 44 of the lower conductor 14A at the edge region adjacent to the bottom face 41. In the same way, the depressed portion 25 is also formed on each side face of the upper conductor 14B at the edges adjacent to the bottom face of the upper conductor 14B. The rest of the configuration is the same as the first embodiment.

By this depressed portion 25, the contact area between the lower conductor 14A and the insulation film 15B increases, and the protruded portion 23 of the insulation film 15B that fills the depressed portion 25 exhibits an anchor effect, so the insulation film 15B does not separate easily. In the same way, the insulation film 15D does not separate easily because of the depressed portion 25 formed in the upper conductor 14B.

In the case of the present embodiment, however, the AC resistance value in the high frequency band of the lower conductor 14A and the upper conductor 14B tends to increase compared with the case of the first and second embodiments which have chamfered base side corner sections 20. This is because of the decrease in the effective cross-section due to the skin effect of the conductor. Generally current concentrates more on the surface of the conductor as the frequency of the electric signals, which propagates the conductor, increases. This phenomenon is called the "skin effect," and the cross-section in a depth direction of the area where the current flows is called the "effective cross-section." At a sharp corner section of the conductor, the effective cross-section decreases due to this skin effect, so the current that flows through the conductor in the high frequency band also decreases. As a result, the AC resistance values of the conductor increases.

In the case of the depressed portions 25 of the present embodiment, a plurality of right angle corner sections are formed in the lower conductor 14A, so the effective cross-section decreases due to the skin effect, and the AC resistance value in the high frequency band tends to increase. While in the case of the first and second embodiments, the right angle or acute angle corner sections are removed from the lower conductor 14A and upper conductor 14B by chamfering the base side corner sections 20. Therefore the decrease of the effective cross-section due to the skin effect is suppressed, and the increase in the AC resistance value of the solenoid coil 14 in the high frequency band can be suppressed.

The present invention was described above according to the embodiments thereof. However the present invention is not limited to the above embodiments. The present invention can be modified in various ways within the scope of the spirit thereof.

According to the first embodiment, both of the base side corner sections 20 are chamfered in the lower conductor 14A and upper conductor 14B respectively, but the resin films 15B and 15D do not separate easily even if only one of the base side corner sections 20 is chamfered. In the same way, according to the second embodiment, both of the upper side corner sections 24 are chamfered in the lower conductor 14A and upper conductor 14B respectively, but the resin films 15B and 15D in the upper sections of the lower conductor 14A and the upper conductor 14B do not separate easily even if only one of the upper side corner sections 24 are chamfered.

In the second embodiment, the upper side corner sections 24 of the conductor pattern are chamfered so that the surface thereof forms a curved surface, but may be chamfered so that the surface thereof becomes flat.

According to the above embodiment, the seed layer 19 is removed by wet etching, as shown in FIG. 7, but may be removed by dry etching (e.g. reactive ion etching). In this method, the seed layer 19 may remain under the base side corner sections 20, as shown in FIG. 11. In this case, the resin film 15B is filled into an area between the base side corner section 20 and the seed layer 19. With this configuration as well, the contact area between the lower conductor 14A and the resin film 15B increases because of the chamfered base side corner sections 20, and the portion of the resin film 15B entering under the base side corner sections 20 exhibits an anchor effect, and the separation of the resin film 15B can be suppressed. This is the same for the upper conductor 14B.

The above embodiments are the thin film inductor having a coil as the conductor pattern, but the thin film device of the present invention may have another arbitrary conductor pattern. If the conductor pattern is interconnection, then $0<h<0.1H$ is preferable, where the maximum height of the chamfered base side corner section of the interconnection from the top face of the base is h, and the height (thickness) of the interconnection itself is H. This is because if chamfering is too large, the cross-section of the interconnection becomes small, and the wire resistance increases.

In the above embodiments, the conductors 14A and 14B are prismatic, but the shape of the conductor pattern of the thin film device of the present invention is arbitrary. If the conductor pattern is regarded as a set of micro-patterns extending in a predetermined direction, the length of the line of the intersection between the surface of the base side corner section of each micro-portion and the plane vertical to the direction of this micro-pattern extending (this is the same as the direction of the base side corner section extending) corresponds to the above mentioned w, and the maximum height of the line of intersection from the main surface of the base corresponds to the above mentioned h. As mentioned in the first embodiment, if w/h is 1.15 or more, the separation of the resin film is effectively suppressed.

In the above embodiments, the depressed portions 43a, 44a or 25 on the side face of the conductor are filled with the resin film. However, if a part of the resin film extends into the depressed portion, the separation of the resin film is suppressed to some extent by the sheer stress of this portion, even if [the depressed portion] is not filled with the resin film. If the depressed portion is filled with the insulation film, the resin film separates less easily since sheer stress increases accordingly.

The above embodiments are the case of the thin film inductor, but the present invention can be widely applied to the thin film device where the patterned conductors are covered with the insulation film. Therefore the present invention can be applied not only to a thin film inductor, but also to other thin film devices, such as a device having a in film coil and a thin film capacitor.

What is claimed is:

1. A thin film device, comprising:
   a plate-shaped base;
   a conductor pattern formed on one of main surfaces of said base through a seed layer; and
   a first resin film that is formed on said main surface, a second resin film that is formed on one face of said first resin film opposite another face contacted with said main surface of said base, and a third resin film that is formed on an upper face of said second resin film opposite a lower face contacted with the said first resin film, wherein
   said conductor pattern comprises a lower conductor, an upper conductor and a connection conductor,
   said lower conductor is formed through a lower seed layer on said main surface of said base and is covered with said first resin film,
   said upper conductor is formed through an upper seed layer on an upper face of said second resin film and is covered with said third resin film,
   said connection conductor penetrates said first and second resin films and connects said lower conductor with said upper conductor electrically,
   said lower conductor has a bottom face disposed on said main surface of said base, a top face that faces said bottom face of said lower conductor and is distant from said main surface of said base, and two side faces that connect said bottom face and said top face,
   a depressed portion of said lower conductor is formed in an edge region of said lower conductor adjacent to said bottom face of said lower conductor and at least one of said two side faces of said lower conductor,
   said lower conductor has a base side corner section chamfered by said depressed portion of said lower conductor,
   said base side corner section of said lower conductor is chamfered so that a surface thereof forms a curved surface,
   said depressed portion of said lower conductor is filled with said first resin film,
   a part of said first resin film located between said base side corner section of said lower conductor and said main surface of said base is disposed on said lower seed layer,
   said upper conductor has a bottom face disposed on said upper face of said second resin film, a top face that faces said bottom face of said upper conductor and is distant from said upper face of said second resin film, and two side faces that connect said bottom face and said top face,
   a depressed portion of said upper conductor is formed in an edge region of said upper conductor adjacent to said bottom face of said upper conductor and at least one of said two side faces of said upper conductor,
   said upper conductor has a base side corner section chamfered by said depressed portion of said upper conductor,
   said base side corner section of said upper conductor is chamfered so that a surface thereof forms a curved surface,
   said depressed portion of said upper conductor is filled with said third resin film, and
   a part of said third resin film located between said base side corner section of said upper conductor and said upper face of said second resin film is disposed on said upper seed layer.

2. The thin film device according to claim 1, wherein said conductor pattern comprises an other conductor pattern adjacent to the conductor pattern, and said depressed portion of the lower conductor faces a depressed portion of a lower conductor of the other conductor pattern.

3. The thin film device according to claim 1, wherein a line of intersection between the surface of said base side corner section of the lower conductor and a plane vertical to the direction in which said base side corner section of the lower conductor extends has a total length w and a maximum height h from said main surface of said base, where w/h is 1.15 or more.

4. The thin film device according to claim 1, wherein at least one upper side corner section of said conductor pattern is chamfered.

5. The thin film device according to claim 1, wherein the lower conductor is an interconnection,
   a maximum height h of said base side corner section of said interconnection from said main surface of said base and a height H of said interconnection itself satisfy $0<h<0.1H$.

* * * * *